(12) United States Patent
Uehling et al.

(10) Patent No.: US 9,373,539 B2
(45) Date of Patent: Jun. 21, 2016

(54) COLLAPSIBLE PROBE TOWER DEVICE AND METHOD OF FORMING THEREOF

(71) Applicant: Freescale Semiconductor, Inc., Austin, TX (US)

(72) Inventors: Trent S. Uehling, New Braunfels, TX (US); Kelly F. Folts, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 156 days.

(21) Appl. No.: 14/246,345

(22) Filed: Apr. 7, 2014

(65) Prior Publication Data

US 2015/0287654 A1 Oct. 8, 2015

(51) Int. Cl.
*H01L 21/66* (2006.01)
*H01L 21/768* (2006.01)
*H01L 23/00* (2006.01)

(52) U.S. Cl.
CPC .......... *H01L 21/76838* (2013.01); *H01L 22/32* (2013.01); *H01L 24/06* (2013.01); *H01L 24/11* (2013.01); *H01L 24/14* (2013.01); *H01L 22/14* (2013.01); *H01L 24/05* (2013.01); *H01L 24/13* (2013.01); *H01L 24/16* (2013.01); *H01L 24/81* (2013.01); *H01L 2224/0392* (2013.01); *H01L 2224/0401* (2013.01); *H01L 2224/05611* (2013.01); *H01L 2224/05644* (2013.01); *H01L 2224/05647* (2013.01); *H01L 2224/0603* (2013.01); *H01L 2224/119* (2013.01); *H01L 2224/1181* (2013.01); *H01L 2224/11849* (2013.01); *H01L 2224/11901* (2013.01); *H01L 2224/11903* (2013.01); *H01L 2224/131* (2013.01); *H01L 2224/13013* (2013.01); *H01L 2224/13014* (2013.01); *H01L 2224/13147* (2013.01); *H01L 2224/1403* (2013.01); *H01L 2224/14051* (2013.01); *H01L 2224/14131* (2013.01); *H01L 2224/14135* (2013.01); *H01L 2224/14136* (2013.01); *H01L 2224/14177* (2013.01); *H01L 2224/14515* (2013.01); *H01L 2224/16145* (2013.01); *H01L 2224/16227* (2013.01); *H01L 2224/81815* (2013.01)

(58) Field of Classification Search
CPC ..... H01L 33/62; H01L 51/56; H01L 51/0072; H01L 43/12; H01L 45/1233
USPC .................................... 438/14, 613; 257/737
See application file for complete search history.

(56) References Cited

U.S. PATENT DOCUMENTS

| | | |
|---|---|---|
| 5,251,806 A | 10/1993 | Agarwala et al. |
| 6,392,163 B1 | 5/2002 | Rinne et al. |
| 6,937,047 B2 | 8/2005 | Tran et al. |
| 7,061,263 B1 | 6/2006 | Ong |
| 7,312,529 B2 | 12/2007 | Clevenger et al. |

(Continued)

*Primary Examiner* — Andy Huynh

(57) ABSTRACT

A collapsible probe tower device and methods of forming thereof, are disclosed. In one example embodiment, a method of forming a device includes providing a semiconductor die substrate having a contact pad and a probe pad, wherein the contact pad and probe pad are adhered to the substrate, forming a contact bump by applying a conductive material to a contact structure surface of a contact tower, wherein the contact tower includes the contact pad, forming a probe bump by applying a conductive material to a probe structure surface of a probe tower, wherein the probe tower includes the probe pad, and heating the conductive material that forms the contact bump and the probe bump to provide a first reflow, wherein after the first reflow, the height of a top surface of the probe bump exceeds the height of a top surface of the contact bump.

21 Claims, 7 Drawing Sheets

(56) References Cited

U.S. PATENT DOCUMENTS

| | | |
|---|---|---|
| 7,884,471 B2 | 2/2011 | Tsai et al. |
| 2005/0007129 A1* | 1/2005 | Pu .................. G01R 31/2831 324/754.18 |
| 2005/0224970 A1* | 10/2005 | Matsuki ................ H01L 22/32 257/737 |
| 2014/0151700 A1* | 6/2014 | Meyer .................... H01L 22/32 257/48 |
| 2014/0175661 A1* | 6/2014 | Kim ....................... H01L 24/17 257/773 |

* cited by examiner

COLLAPSIBLE PROBE TOWER DEVICE AND METHOD OF FORMING THEREOF

CROSS-REFERENCE TO RELATED APPLICATIONS

--

STATEMENT REGARDING FEDERALLY SPONSORED RESEARCH OR DEVELOPMENT

--

FIELD OF THE DISCLOSURE

The present disclosure relates to methods and systems for forming and testing microelectronic devices, more particularly, semiconductor devices.

BACKGROUND OF THE DISCLOSURE

Semiconductor devices, such as Integrated Circuits (IC's) are commonly found in electronic consumer products. IC's include a plurality of contacts for interconnection with circuit boards and other electronic components. The contacts are secured to a circuit board (i.e., package substrate) either directly or through an interposer. An interposer is an interface substrate that can be used to pass signals directly between, or to spread or otherwise reroute, connections from the IC to connections on a circuit board or another IC. Use of the interposer allows for a high density of connections on the IC to be distributed in a desired architecture across another component (e.g., circuit board).

As many modern devices have mounting space restrictions, some devices utilize a flip-chip method for interconnecting an IC to external circuitry. Flip-chip IC's include solder micro-bumps that have been deposited onto various contact pads on the IC. The contact pads are interconnected with the internal circuitry of the IC. The solder micro-bumps are deposited on the contact pads on the top surface of the IC during processing. With the solder micro-bumps in place, the IC can then be mounted on top of a mating component (e.g., circuit board, an interposer, or another IC), thereby reducing the size of the surface area needed on the mating component.

Mounting a flip-chip IC involves flipping it over so that the top surface of the IC (having the solder micro-bumps) can be placed over the mating component to align the solder micro-bumps with associated contact pads on the mating component. The solder is heated (i.e., reflowed) to complete the connection between the flip-chip IC and the mating component. Prior to installation of the flip-chip IC, the flip-chip IC is typically tested to identify any defects. The flip-chip IC can include various testing points that are configured to be contacted with a test probe for performing suitable testing of the flip-chip IC. The solder micro-bumps include a very fine pitch, which can be easily damaged when contacted by a rigid object. Therefore, to accommodate the test probe, test probe pads are interspersed among the contact pads to provide testing points. During testing, the test probe is extended downwards to contact one or more test probe pads to provide an electrical connection between the test probe and one or more circuits on the flip-chip IC.

DETAILED DESCRIPTION

As will be apparent from the further discussion provided below, at least some embodiments encompassed herein envision a collapsible probe tower provided on a semiconductor device. The collapsible probe tower provides numerous advantages in the testing and fabrication of semiconductor devices. More particularly, the desire to provide internal circuit test points (i.e., probe pads) on IC devices has limited the density of contacts (contact bumps) that may be provided on a surface of the IC that is intended to be mated with another device, for example, flip-chip devices. As contact bumps have been traditionally situated at a height greater than probe pads to allow for mating of the IC with another device, generous clearance space is provided between a probe pad and adjacent contact bumps. The clearance space is provided to accommodate a test probe that is ascended onto the probe pad during testing. In the present disclosure, various embodiments are provided that allow for increased density by reducing the clearance space between the probe pad and contact bumps. In some embodiments, this is accomplished by providing a collapsible probe tower. The collapsible probe tower provides a probe bump that is situated above the probe pad at a height that can exceed the height of the contact bump for testing purposes. As will be discussed in detail below, the probe bump can then be reduced to a height below the contact bumps using a reflow process. After the reduction in height, the contact bumps can be mated with another device's contact bumps without interference from the previously extended probe bump. In addition, the collapsible probe tower allows for the fabrication of the probe bump and contact bump using a single conducting layer of material. These, and other various features of the collapsible probe tower, are described in detail below.

Figure 1:
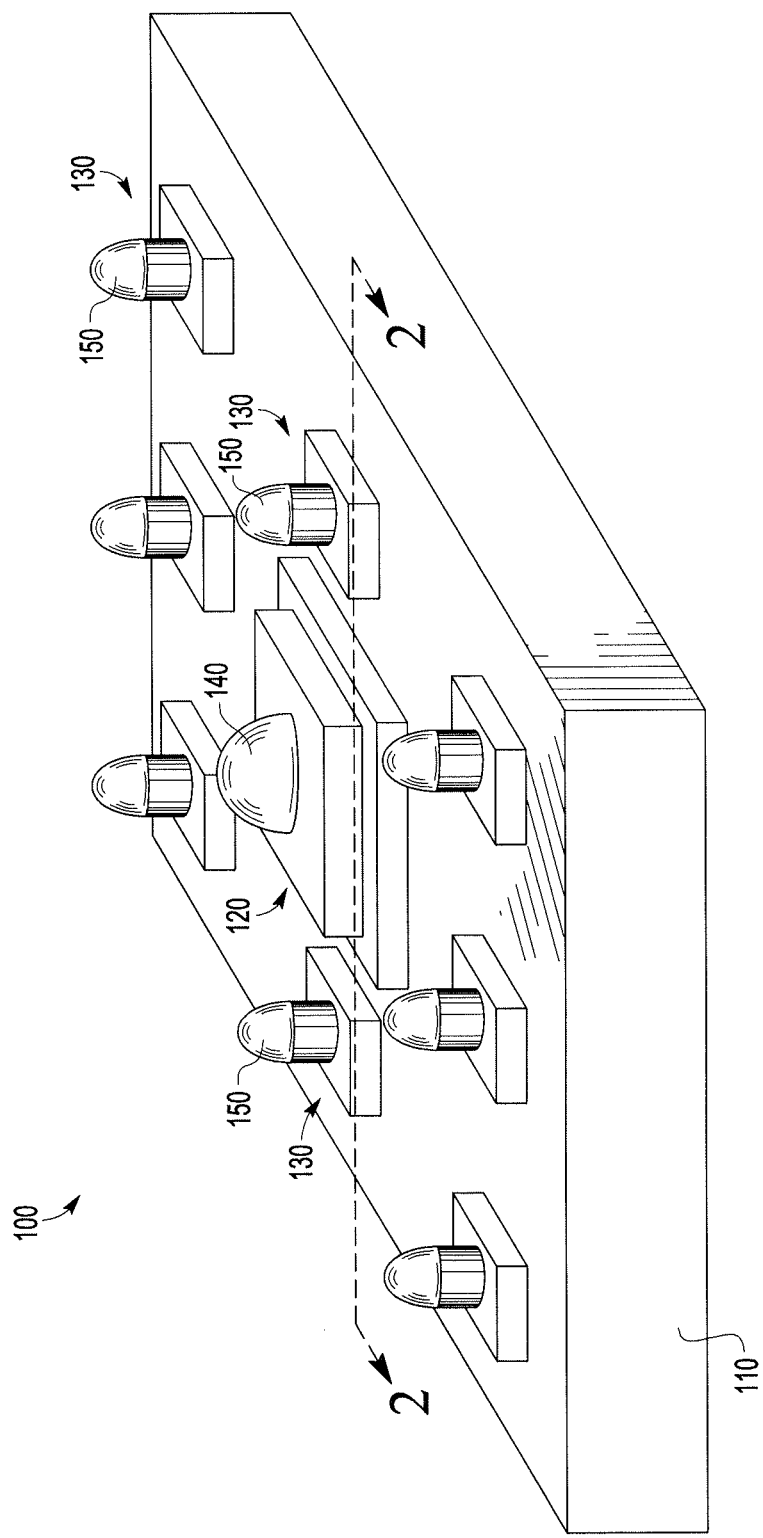
FIG. 1 is a perspective view of an exemplary semiconductor device that, in accordance with an embodiment of the present disclosure, employs a collapsible probe contact.

Referring to FIG. 1, a perspective view is provided of an Integrated Circuit (IC) device 100. The device 100 can take a variety of forms including various semiconductor devices, such as flip-chip devices, which can be configured for example, as a microprocessor, a graphic processing unit, a memory device, analog and/or digital logic Microelectromechanical system (MEMS), a microcontroller, or an application-specific integrated circuit. In accordance with the present disclosure, the device 100 includes a semiconductor substrate (e.g., a die) 110 having a conducting probe tower 120 and a plurality of adjacent conducting contact towers 130, each extending from the substrate 110. The probe tower 120 and contact towers 130 are in electrical communication with the internal circuitry (not shown) of the device 100. The probe tower 120 can be comprised of several layers, including a conductive probe bump 140 that is configured to provide a testing point for the internal circuitry of the device 100. In addition, the contact towers 130 can be comprised of several layers, including a conductive contact bump 150 (i.e., microbump) that provides an electrical connection to the internal circuitry of the device 100. The contact towers 130 are configured to be interconnected with an interface device, such as a circuit board, an interposer, or another IC device.

Prior to interconnection with another device, the device 100 is tested for proper functionality. During the testing process, a test probe 1100 (see FIG. 11) is placed in contact with the probe bump 140. In many IC devices, the quantity of contact towers 130 adjacent to a probe tower 120 can be significant. This high density of contact towers 130 can limit access to the probe tower 120. More particularly, lowering the test probe 1100 to contact the probe bump 140 can result in inadvertent contact with adjacent contact bumps 150 on the contact tower 130, which can damage the contact bumps 150 or cause an electrical short condition in the device 100.

In the present embodiment, to limit or prevent inadvertent contact of the test probe 1100 with the contact towers 130, the probe tower 120 is formed to a height that exceeds the height of the contact towers 130. In this manner, the test probe 1100 can remain at a safe distance above the contact towers 130 during the testing process. As will be discussed in greater detail below, once testing of the device 100 is complete, the probe bump 140 can be heated, allowing the conductive material in the probe bump 140 to reflow and spread out, thereby reducing the height of the probe bump 140. In the present embodiment, the height of the probe bump 140 is reduced until the probe tower 120 is below the height of the contact towers 130, or in some embodiments, at the same height as the contact towers 130. Lowering the height of the probe bump 140 allows the device 100 to be mounted to an interface device without interference.

Figure 2:
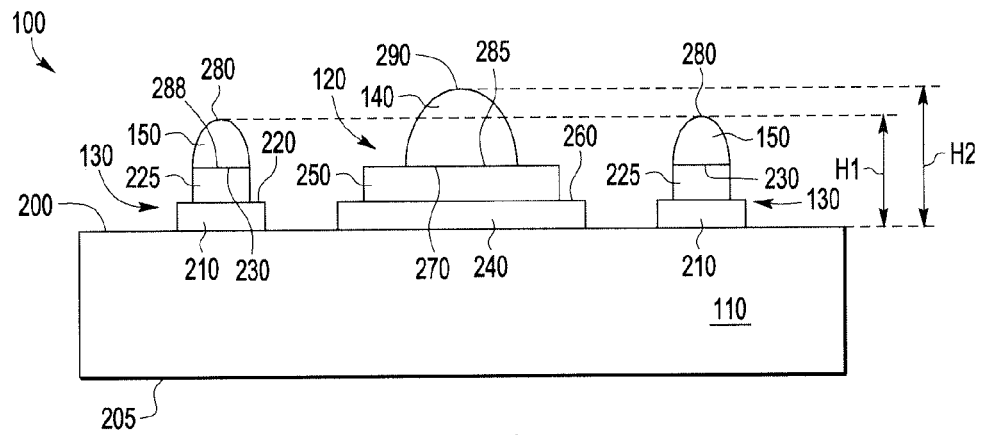
FIG. 2 is a cross-sectional view of the device of FIG. 1.

Referring to FIG. 2, a cross-sectional view of the device 100 of FIG. 1 is provided. As shown, the device 100 includes the substrate 110, having a substrate top surface 200 and a substrate bottom surface 205. As discussed above, the substrate 110 includes internal circuitry (not shown) in communication with various contact towers 130 and probe towers 120 that extend from a substrate top surface 200. In the present embodiment, the contact towers 130 and probe towers 120 include multiple layers of conductive material. More particularly, in at least some embodiments, the contact tower 130 includes a contact pillar 225, the contact bump 150, and a contact pad 210, wherein the contact pillar 225 provides a contact structure surface, such as a contact pillar top surface 230 for receiving the contact bump 150. The contact pad 210 is a conductive layer adhered to the substrate top surface 200 and is in communication with a select circuit component embedded in the substrate 110 (e.g., through conductive interconnect structure in the interconnect region (not shown)). The contact pad 210 includes a contact pad top surface 220, to which the contact pillar 225 is adhered thereon. The contact pillar 225 includes the contact pillar top surface 230 to which a contact bump bottom surface 288 of the contact bump 150 is adhered thereon. In at least some other embodiments, the contact tower 130 includes the contact bump 150 and the contact pad 210, wherein the contact bump 150 is formed on the contact pad 210, without an intervening contact pillar 225, and wherein the contact pad 210 provides a contact structure surface, such as the contact pad top surface 220 for receiving the contact bump 150.

A device 100 can include numerous contact towers 130 on the substrate 110. As discussed above, probe towers 120 are interspersed among the contact towers 130, thereby placing one or more contact towers 130 adjacent to a probe tower 120. Similar to the contact towers 130, in the present embodiment, the probe towers 120 can include multiple layers of conductive material. More particularly, in at least some embodiments, the probe tower 120 includes a probe pillar 250, the probe bump 140, and a probe pad 240, wherein the probe pillar 250 provides a probe structure surface, such as a probe pillar top surface 270 for receiving the probe bump 140. The probe pad 240 is a conductive layer adhered to the substrate top surface 200 and is in communication with a select circuit component embedded in the substrate 110 (e.g., through conductive interconnect structure in the interconnect region (not shown)), and is utilized for testing the internal circuitry of the device 100. The probe pad 240 includes a probe pad top surface 260, to which the probe pillar 250 is adhered thereon. The probe pillar 250 includes the probe pillar top surface 270, to which a probe bump bottom surface 285 is adhered thereon. In at least some other embodiments, the probe tower 120 includes the probe bump 140 and the probe pad 240, wherein the probe bump 140 is formed on the probe pad 240 without an intervening probe pillar 250, and wherein the probe pad top surface 260 provides a probe structure surface for receiving the probe bump 140.

Referring further to FIG. 2, the contact tower 130 has a height H1 that extends between the substrate top surface 200 and a contact bump top 280. In a preferred embodiment, H1 is about 80 microns +/−5 microns, although in other embodiments H1 can range from about 25 microns to about 125 microns, while still in other embodiments H1 can include values below 25 microns and above 125 microns. The probe tower 120 has a height H2 that extends between the substrate top surface 200 and a probe bump top surface 290. In a preferred embodiment, H2 is about 95 microns +/−5 microns, although in other embodiments H2 can range from about 40 microns to about 140 microns, while still in other embodiments H2 can include values below 40 microns and above 140 microns.

Figure 3:
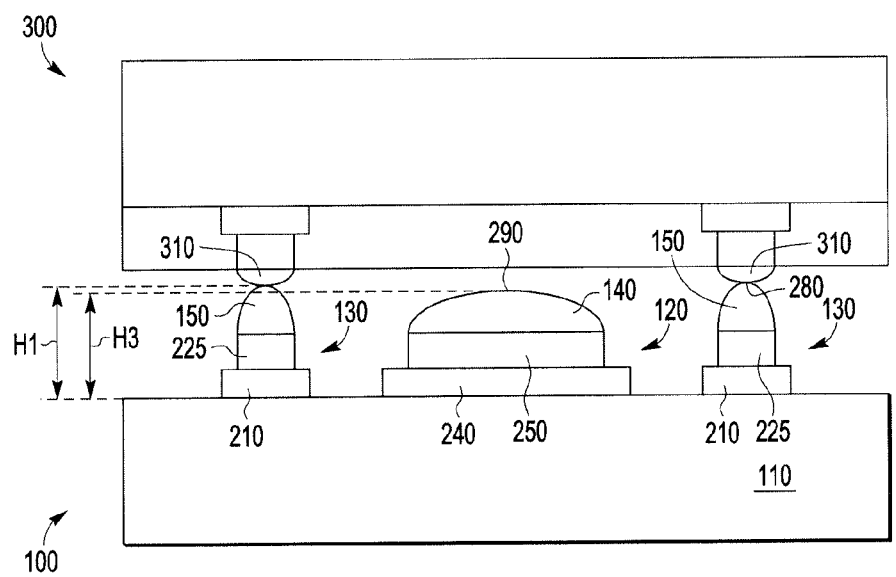
FIG. 3 is a cross-sectional view of the device of FIG. 1 after a second reflow process and interconnected with another device.

As shown in FIG. 2, the height H2 of the probe tower 120 exceeds the height H1 of the contact tower 130. As discussed above, forming the probe tower 120 to have a height that exceeds the height of the contact tower 130 allows for a test probe 1100 to be lowered onto the probe tower 120 without interference from adjacent contact towers 130. As such, damage to the contact towers 130 can be substantially avoided or prevented, without requiring generous space between the probe tower 120 and the adjacent contact towers 130, thereby allowing a higher density of connections in a limited area on the device 100. In addition, the lack of interference from adjacent contact towers 130 can substantially limit or prevent the opportunity for electrically shorting the device 100, which can occur when the conductive test probe 1100 simultaneously contacts the probe tower 120 and one or more contact towers 130. Referring to FIG. 3, a cross-sectional view of the device 100 of FIG. 1 interconnected with an interface device 300 after the probe tower 120 has been reduced in height by a reflow process. As discussed above, forming the probe tower 120 to extend higher than the contact towers 130 provides numerous advantages during testing procedures on the device 100. Although, after testing is complete, the device 100 is to be secured to the interface device 300, which includes mating the contact bumps 150 with interfacing contact bumps 310 on the interface device 300, to form an electrical connection between the devices. In the present embodiment this is accomplished by reducing the height of the probe tower 120, such that the height H1 of the contact towers 130 exceeds the height of the probe tower 120. As shown in FIG. 3, the initial height (H2, FIG. 2) of the probe tower 120 has been reduced to a height H3, thereby providing clearance for the contact bumps 150 and interfacing contact bumps 310 to be joined together. In a preferred embodiment, H3 is about 65 microns +/−5 microns, although in other embodiments H3 can range from about 10 microns to about 110 microns, while still in other embodiments H3 can include values below 10 microns and above 110 microns.

In the illustrated embodiment, the interface device 300 includes the mating interfacing contact bumps 310, but does not include a mating interfacing probe bump. It shall be appreciated that, in at least some embodiments, the probe bump 140 can be utilized as another electrical contact between devices and therefore be connected to a mating interfacing probe bump on the interface device 300. In such embodiments, the probe tower 120 can be reduced to a height that is equal to the height of adjacent contact towers 130. Utilizing the probe bumps 140 as interconnects between devices can provide additional optimization of the space on the device 100. It should be appreciated that the interconnection between the contact bumps 150 and the interfacing contact bumps 310 in a flip-chip configuration can be provided without the use of wire straps, enabling an electrical interconnection with a higher density.

Figure 4:
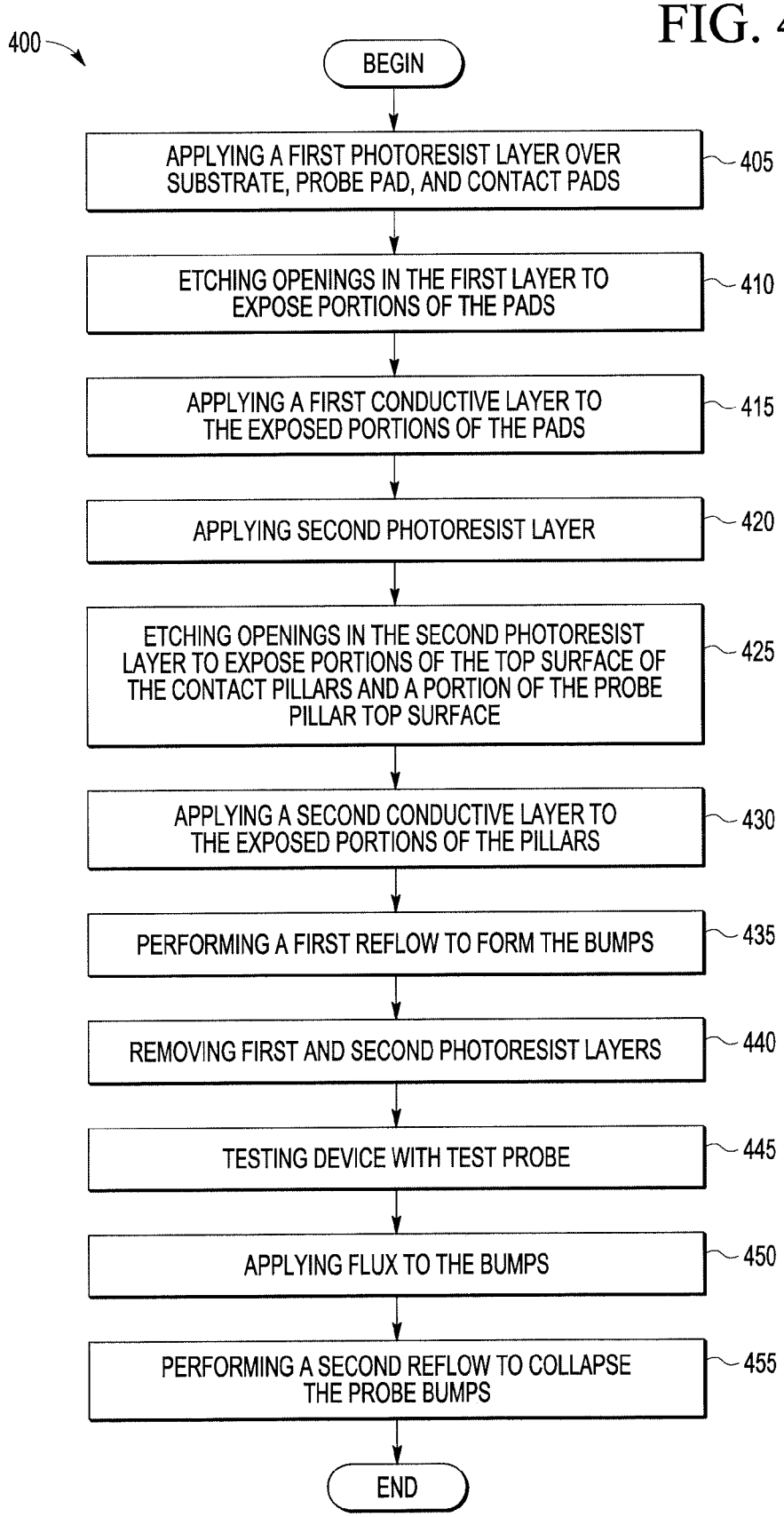
FIG. 4 is an exemplary flowchart 400 that illustrates the various steps of a forming process to form a probe tower and contact towers on the device of FIG. 1.
Figure 5:
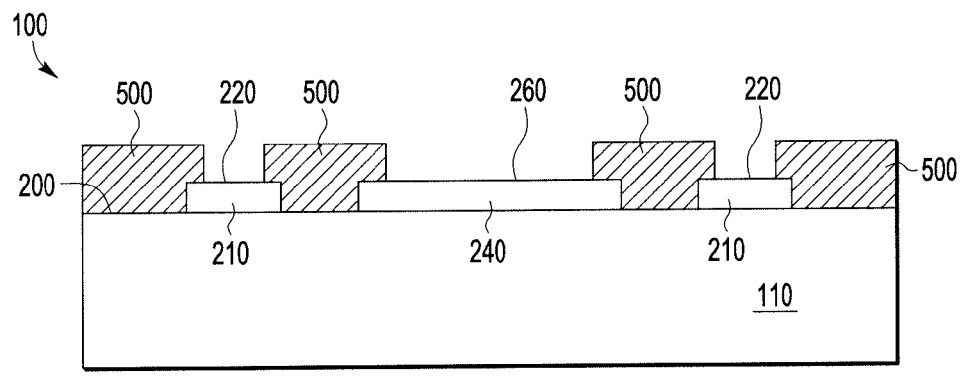
FIG. 5 is a cross-sectional view of the substrate of the device of FIG. 1 with probe pads, contact pads, and a first photoresist layer adhered thereto.
Figure 6:
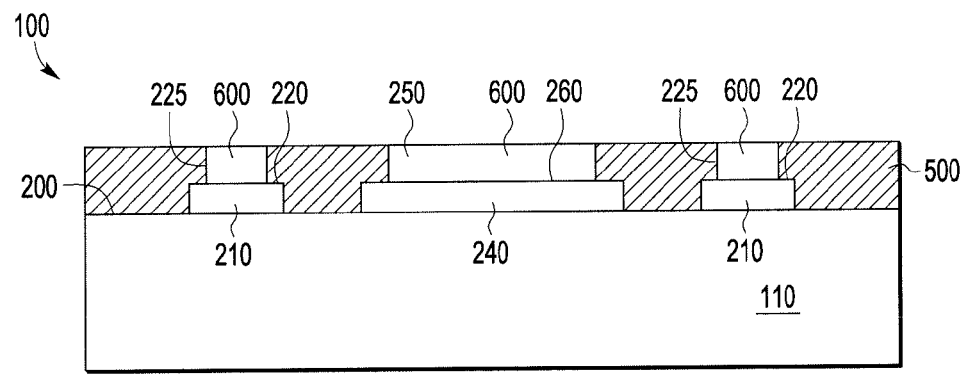
FIG. 6, is a cross-sectional view of the device of FIG. 5 with a first conductive layer adhered thereto.

Referring now to FIG. 4, an exemplary flowchart 400 is provided that illustrates the various steps of a forming and testing process for the probe tower and contact towers on the device 100. In addition, FIGS. 5-12 are referenced accordingly with regard to various steps illustrated in FIG. 4 and which provide cross-sectional views of the exemplary device during the forming and testing process. Beginning at step 405, and referring to FIG. 5, the substrate 110 is provided with the probe pad 240 and the contact pads 210 on the substrate top surface 200. A first photoresist layer 500 is applied over the exposed substrate 110, probe pad 240, and contact pads 210. In the present embodiment, the first photoresist layer 500 includes a negative photo resist material that is applied using photolithography techniques, although various other types of photoresist can be used, such as positive photo resist. In step 410, portions of the first photoresist layer 500 are removed (i.e., etching) to expose portions of the pads 240 and 210, the exposed portions can be circular in shape (as viewed from above), or in other embodiments, other shapes can be formed, such as square, oval, rectangular, etc. In the present embodiment, central portions of the pads 240 and 210 are exposed, as shown in FIG. 5. The contact pad top surface 220 and/or probe pad top surface 260 can be fully or partially exposed. In step 415, a first conductive layer 600 (e.g., plating) is applied onto the exposed portions of the pads 240 and 210, as shown in FIG. 6. The first conductive layer 600 is applied onto the contact pad top surface 220 and forms the contact pillar 225. The first conductive layer 600 is also applied onto the probe pad top surface 260 and forms the probe pillar 250. The contact pillar 225 and probe pillar 250 will take the shape of the previously exposed portions of the contact pad 210 and the probe pad 240, respectively. In the present embodiment, the first conductive layer 600 includes a conductive material, such as copper, although other metals can be utilized, for example nickel and tin.

Figure 7:
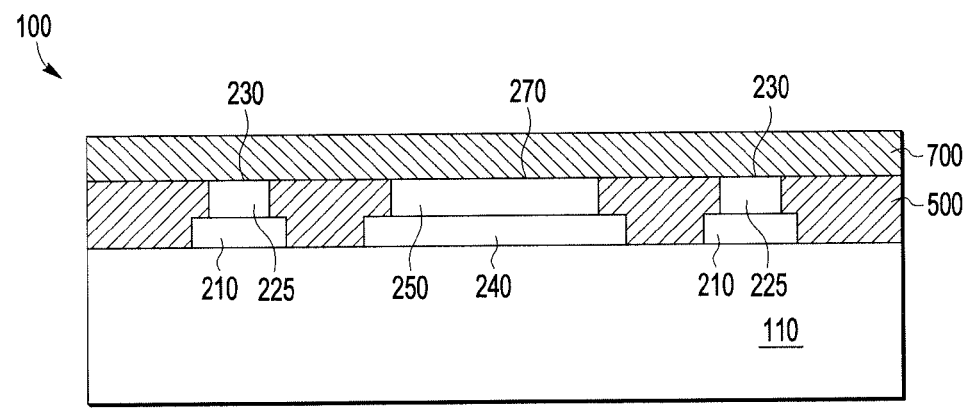
FIG. 7 is a cross-sectional view of the device of FIG. 6 with a second photoresist layer adhered thereto.
Figure 8:
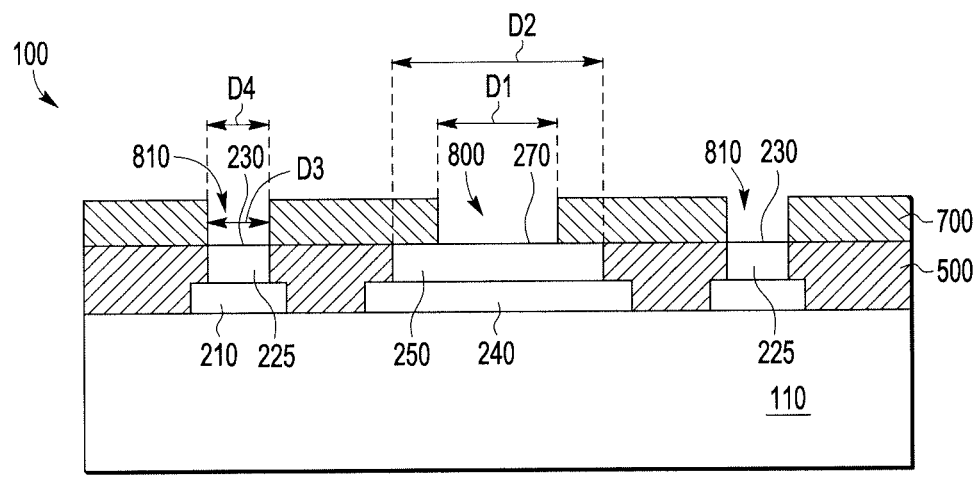
FIG. 8 is a cross-sectional view of the device of FIG. 7 after etching of the second photoresist layer.

Referring to FIG. 7, in step 420, a second photoresist layer 700 is applied over the first photoresist layer 500, a contact pillar top surface 230, and a probe pillar top surface 270. The second photoresist layer 700 can be similar to the first photoresist layer 500 or include other material(s). In step 425, as shown in FIG. 8, the second photoresist layer 700 is etched to expose the contact pillar top surfaces 230 and a portion of the probe pillar top surface 270. More particularly, a probe aperture 800 is etched in the second photoresist layer 700 that resides over the probe pillar top surface 270, wherein the diameter D1 of the probe aperture 800 is less than a diameter D2 of the probe pillar top surface 270. Contact apertures 810 are etched in the second photoresist layer 700 that resides over the contact pillar top surfaces 230, wherein the diameter D3 of the contact apertures 810 are equal to or substantially equal to the diameter D4 of the contact pillar top surfaces 230. In a preferred embodiment, D2 is about 75 microns +/−5 microns, although in other embodiments D2 can range from about 40 microns to about 110 microns, while still in other embodiments D2 can include values below 40 microns and above 110 microns. In at least some embodiments, the probe aperture 800 and contact apertures 810 can each form a circular aperture, although in some other embodiments, one or both can form an aperture having another shape, for example square, oval, rectangular, etc. (as viewed from above). Generally, the probe aperture 800 and contact apertures 810 are shaped to form the desired geometry of the bottom surface of the probe bumps 140 and contact bumps 150.

Figure 9:
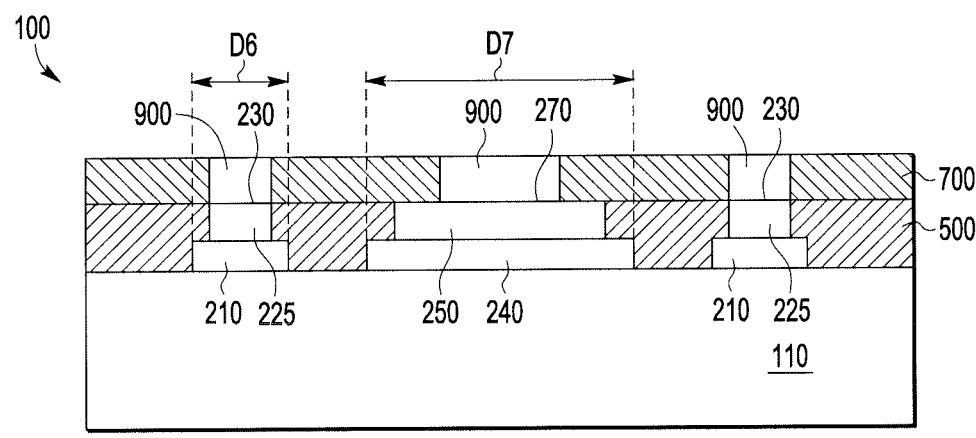
FIG. 9 is a cross-sectional view of the device of FIG. 8 with a second conductive layer adhered thereto.
Figure 10:
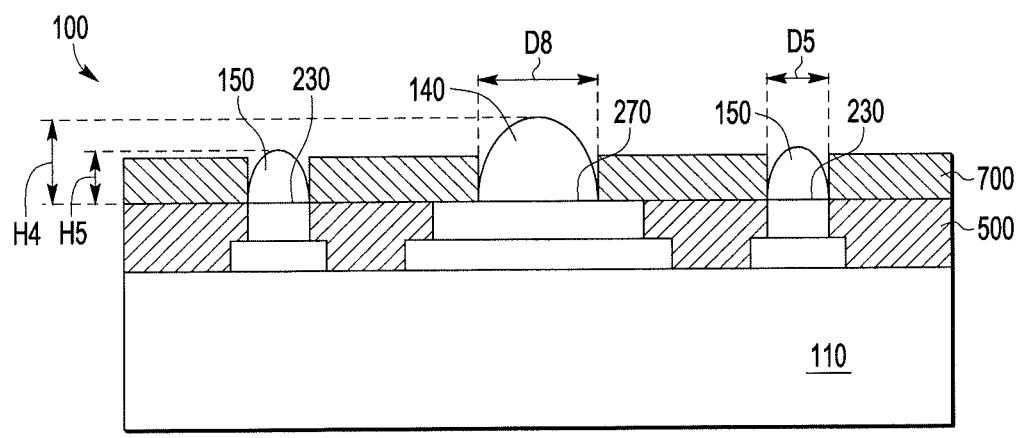
FIG. 10 is a cross-sectional view of the device of FIG. 9 after a first reflow process.

Referring to FIG. 9, in step 430, a second conductive layer 900 is applied onto the exposed contact pillar top surface 230 and exposed probe pillar surface 270. In the present embodiment, the second conductive layer 900 is a soldering material, although other types of conductive materials can be provided. With reference to FIG. 10, in step 435, the second conductive layer 900, previously adhered to the pillars 225 and 250, is heated to provide a first reflow of the conductive material, which is segregated by the remaining second photoresist layer 700. During the first reflow, the second conductive layer 900 that is adhered to the probe pillar top surface 270 is melted. Due to the surface tension of the molten conductive layer, the probe bump 140 forms a dome-shape to minimize surface energy. The dome-shaped probe bump 140 is adhered to the probe pillar 250, as shown in FIG. 10. Likewise, the second conductive layer 900 that is adhered to the contact pillar top surface 230 is also melted. Due to surface tension of the molten conductive layer, the contact bump 150 forms a dome-shape to minimize surface energy. The dome-shaped contact bump 150 is adhered to the contact pillar 225.

In the present embodiment, the probe bumps 140 and contact bumps 150 are formed to include a circular bottom surface, although in other embodiments, one or both can be formed in another shape, for example square, oval, rectangular, etc. For convenience, and with reference to a circular bottom surface of the probe bumps 140 and the contact bumps 150 (i.e., probe bump bottom surface 285 and contact bump bottom surface 288 (FIG. 2)) as well as the surfaces that the probe bumps 140 and contact bumps 150 are formed on, such as the probe pillar top surface 270 and contact pillar top surface 230 (discussed below), or if the contact pillar and probe pillar are omitted, then the probe pad and contact pad surfaces (e.g., probe pad top surface 1350), the size of the bottom surface is measured with reference to a corresponding diameter. It is to be understood, that when the referenced surface is not circular (e.g., square, etc.) that the overall area of a surface can be calculated using $$Area = \frac{1}{4}\pi d^2,$$

where d is the diameter. In this manner, an equivalent surface area can calculated to accommodate different shapes.

Figure 11:
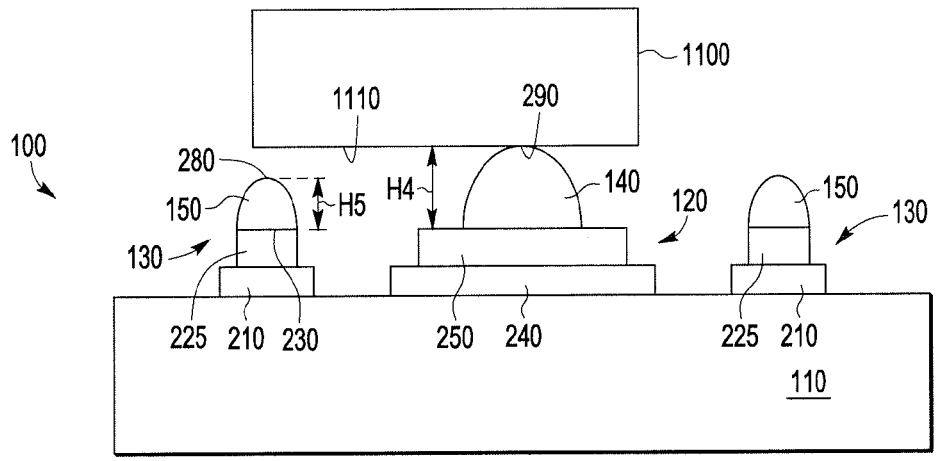
FIG. 11 is a cross-sectional view of the device of FIG. 10 after the first and second photoresist layers have been removed.
Figure 12:
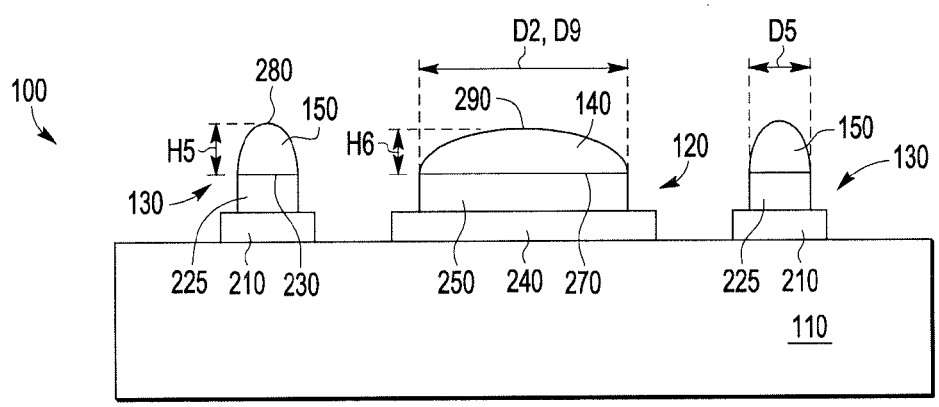
FIG. 12 is a cross-sectional view of the device of FIG. 11 after a second reflow process.

Further referring to FIG. 10, the probe bump 140 and contact bumps 150 are shown after the first reflow is complete. As shown, the probe bump 140 has a height H4 that exceeds the height H5 of the adjacent contact bumps 150. In at least some embodiments, the difference between height H4 and height H5 can range from about 10 microns to about 20 microns, while in further embodiments, the difference can vary by a greater or lesser distance. The bumps 140 and 150 had the same height prior to the first reflow, although, due to the larger diameter D1 (FIG. 8) of the probe aperture 800 relative to the diameter D3 (FIG. 8) of the contact apertures 810, the probe bump 140 includes a greater quantity of conductive material and therefore, when melted during the first reflow, forms a dome shape that rises higher than the lesser quantity of conductive material found in the contact aperture 810. In addition, the probe bump 140, at least the probe bump bottom surface 285 (FIG. 2), includes a diameter D8 (FIG. 10) equal to or substantially equal to the diameter D1 of the probe aperture 800, and the contact bump 150 maintains a contact bump bottom surface diameter D5 (FIG. 12) equal to or substantially equal to the diameter D3 of the contact aperture 810. In a preferred embodiment, D5 is about 20 microns +/−5 microns, although in other embodiments D5 can range from about 10 microns to about 40 microns, while still in other embodiments D5 can include values below 10 microns and above 40 microns. Following the first reflow in step 435, the first and second photoresist layers 500 and 700 are removed from the device 100 in step 440, as shown in FIG. 11. After step 440, the device 100 is ready to be tested by the test probe 1100 in step 445. As shown, when a test probe 1100 is lowered to provide contact between a test probe bottom surface 1110 and the probe bump top 290, the test probe bottom surface 1110 does not contact the adjacent contact bump top 280. Upon completion of testing in step 445, the device 100 can be prepared for immediate or later mounting to one of various potential interface devices 300. In step 450, a flux material is applied to the bumps 140 and 150. In step 455, a second reflow process is performed to collapse the probe bump 140 to a height below or equal to the height of the contact bumps 150, to allow mounting of the device 100 to the interface device 300. Similar to the first reflow process, the second conducting material 900 that forms the bumps 140 and 150 is melted again. FIG. 12 illustrates the device 100 after the probe bump 140 has been collapsed.

As shown in FIG. 12, and in contrast to FIG. 11, the height H4 of the probe bump 140 has been reduced to a height H6 by the second reflow process, with the height H6 being less than the height H5 of the contact bump 150. The reduction in height occurs as the probe bump 140 is allowed to expand along the exposed probe pillar top surface 270 during the second reflow process. The expansion of the probe bump 140 is a result of the removal of the second photoresist layer 700 that constrained expansion of the probe bump 140 during the first reflow process. After expansion, the diameter of the probe bump bottom surface 285 extends to a diameter D9, which is the same or substantially the same as the diameter D2 of the probe pillar top surface 270. In a preferred embodiment, D9 is about 75 microns +/−5 microns, although in other embodiments D9 can range from about 40 microns to about 110 microns, while still in other embodiments D9 can include values below 40 microns and above 110 microns. As the diameter of the contact bump 150 was already sized to the diameter of the contact pillar top surface 230, the contact bump 150 does not expand in diameter during the second reflow process, and therefore, the height H5 is not reduced during the second reflow process. As noted above, it is to be understood that in at least some embodiments, reference to the diameter of the probe bump 140 is intended to reference the diameter of the probe bump bottom surface 285. Similarly, it is to be understood that reference to the diameter of the contact bump 150 is intended to reference the diameter of the contact bump bottom surface 288.

The probe bump 140 and the contact bumps 150 can be sized for convenience, although to assist in the application of the test probe 1100 to the probe bump 140, the probe bump 140 can be sized larger than the contact bumps 150. In the present embodiment, the probe bump 140 has a diameter of at least twice that of the contact bump 150 (after the first reflow, but before the second reflow), although in other embodiments, the probe bump 140 can otherwise vary in size relative to the contact bump 150, to accommodate various criteria, for example, the specific application, device configuration, test probe size, etc. In addition, to further assist with testing as well as to protect the device 100 and integrity of the contact bumps 150, in the present embodiment, the probe tower 120 includes a height that is at least 10 microns higher than the contact towers 130, prior to the first reflow, and at least 15 microns lower than the contact towers 130 after the second reflow. Assuming that the height of the pads 210 and 240 are the same and the height of the pillars 225 and 250 are the same, then the respective 10 and 15 micron differences would be in the bumps 140 and 150 themselves. In some embodiments, the probe tower 120 can include a height that is less than or greater than 10 microns higher than the contact towers 130. Further, in the present embodiment, to accommodate a desired reduction in height below the contact bump 150, the probe pad 240 is sized to have a diameter that is at least 1.6 times the diameter of the probe bump 140 prior to the second reflow, although in other embodiments, the probe pad 240 can otherwise vary in size relative to the probe bump 140 to accommodate various criteria, for example, the specific application, device configuration, test probe size, etc.

In one exemplary embodiment, the probe pillar 250 includes a diameter D2 (FIG. 8) of about 75 microns and the probe bump 140 has a pre-second reflow diameter D8 (FIG. 10) of about 45 microns. In addition, the probe bump 140 has a pre-second reflow height H4 (FIG. 10) of about 27 microns, whereas the contact bump 150 has a height H5 of about 19 microns. After the second reflow, the height H4 of the probe bump 140 is reduced to the height H6 (FIG. 12) of about 11 microns and the diameter D8 of the probe bump bottom surface 285 is expanded to a diameter D9 (FIG. 12) equal to about 75 microns, which is equal to or substantially equal to the diameter D2 of the probe pillar 250. In another exemplary embodiment, the probe bump 140 is situated on a 90 micron probe pillar 250 and includes a pre-first reflow height H7 (FIG. 9) of about 20 microns, and a post-first reflow height H4 of about 28 microns, and having a diameter D8 of about 50 microns. Additionally, in at least some embodiments, the contact pillar top surface 230 is referred to as a contact tower surface for receiving the contact bump 150 thereon, wherein the contact tower surface has the same diameter as the contact bump bottom surface 288. Further, in at least some embodiments, the, the probe pillar top surface 270 is referred to as a probe tower surface for receiving the probe bump 140 thereon, wherein the probe tower surface has the same diameter as the probe bump bottom surface 285.

After the second reflow, the height H6 of the probe bump 140 is reduced to about 12 microns. The height of the contact bump 150 pre-first reflow is also about 20 microns, although, in contrast to the probe bump 140, after the first reflow, as well as the second reflow, it is only slightly reduced in height, to a height of about 19 microns, leaving the top surface of the probe bump 140 to have a height that is less than the height of the top surface of the contact bump 140. As such, in at least some embodiments, the difference in height between the top surfaces of the contact bump 150 and the probe bump 140 is about 7 microns, although in at least some other embodiments, the difference in height can range from about 5 microns to about 10 microns, while in yet further embodiments, the difference in height can be less than 5 microns and/or greater than 10 microns. In yet another exemplary embodiment, the probe bump 140 is situated on a 75 micron probe pillar 250 and includes a pre-first reflow height H7 (FIG. 9) of about 20 microns, and a post-first reflow height H4 of about 27 microns, and having a diameter D8 of about 45 microns. After the second reflow, the height H6 of the probe bump 140 is reduced to about 11 microns and the diameter D8 of the probe bump 140 is expanded to the diameter D9 of the about 75 microns. Further, referring to FIG. 12, in a preferred embodiment, the ratio D9/D5 is about 3.75, although in other embodiments the ratio D9/D5 can range from about 2.5 to about 5.0, while still in other embodiments the ratio D9/D5 can include values below 2.5 and above 5.0. Additionally, in a preferred embodiment, the ratio H5/H6 is about 1.7, although in other embodiments the ratio H5/H6 can range from about 1.2 to about 2.2, while still in other embodiments the ratio H5/H6 can include values below 1.2 and above 2.2.

Figure 13:
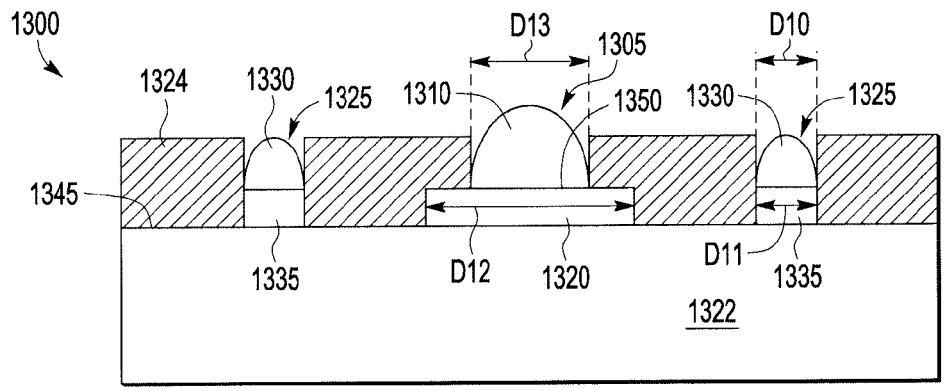
FIG. 13 is a cross-sectional view of another embodiment of the device.

As discussed above, in the present embodiment, the device 100 is configured to include the bumps 140 and 150 adhered to respective pillars 225 and 250. In at least some embodiments, the device 100 can be formed without the addition of the pillars 225 and 250. Referring to FIG. 13, a device 1300 is illustrated that does not include probe pillars or contact pillars. As shown, a probe tower 1305 includes a probe bump 1310 adhered directly to a probe pad 1320 on a substrate 1322. In addition, contact towers 1325 include contact bumps 1330 adhered directly to contact pads 1335 on the substrate 1322. In this embodiment, the probe pad 1320 and the contact pads 1335 have a solder-wettable surface to facilitate the spread of solder during a second reflow. The solder wettable surface could be copper, gold, tin, or another conductive material or combination of materials. Further, the diameter D10 of the contact bumps 1330 are sized to match the diameter D11 of the contact pads 1335, and the diameter D12 of the probe pad 1320 is sized larger than the diameter D13 of the probe bump 1310, to allow for expansion during the second reflow process. In addition, as the formation of pillars is not necessary, a second photoresist layer would not be necessary, although in some embodiments, multiple photoresist layers can be utilized.

Figure 14:
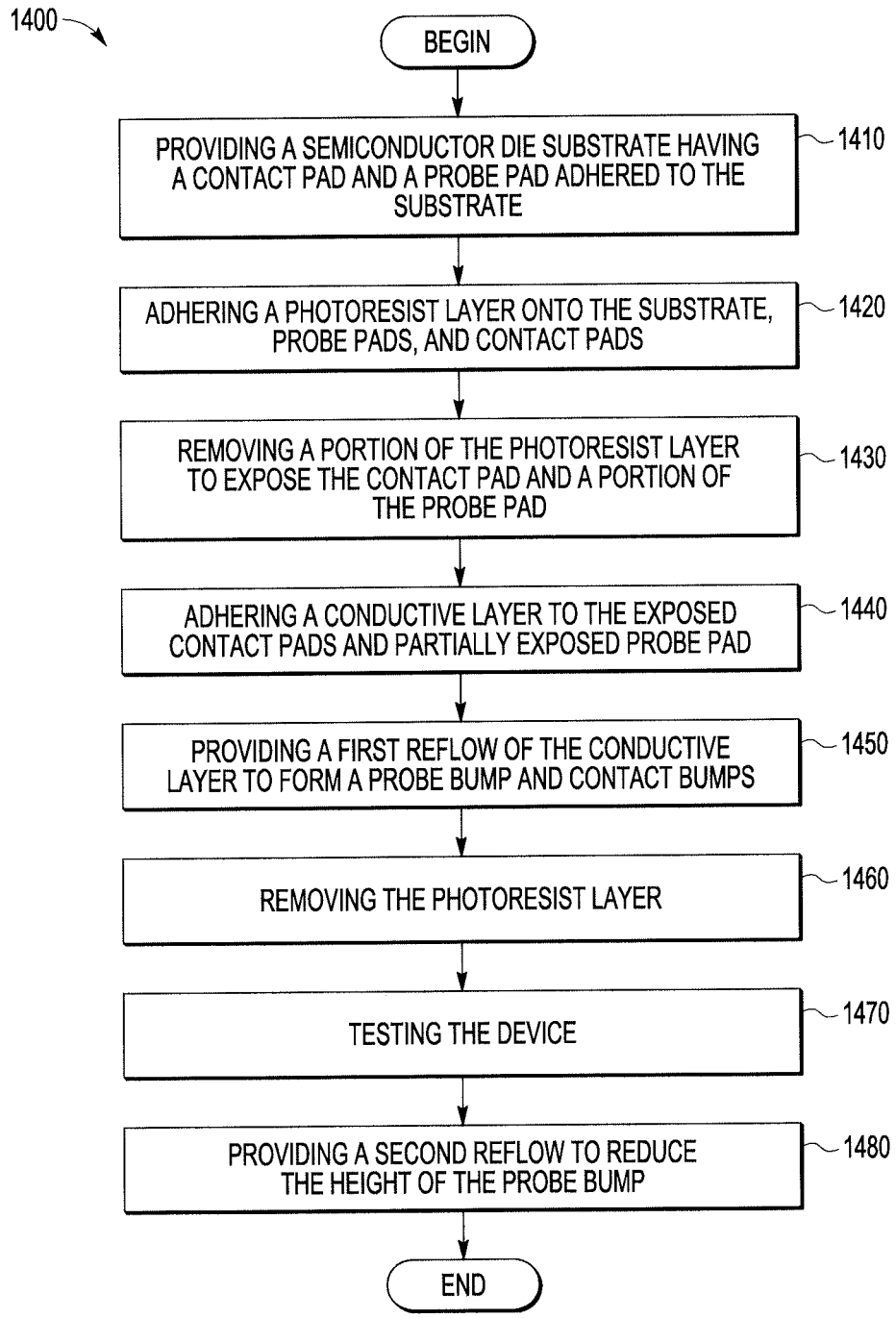
FIG. 14 is an exemplary flowchart 1400 that illustrates various exemplary steps of a forming process to form a probe tower and contact towers on the device of FIG. 13.

FIG. 14 provides an exemplary flowchart 1400 that illustrates various exemplary steps of the forming process to form the probe tower 1305 and contact towers 1325 on the device 1300 of FIG. 13. More particularly, in step 1410, the substrate 1322 is provided, having the contact pad 1335 situated adjacent to the probe pad 1320, wherein the contact pads 1335 and the probe pad 1320 are adhered to the substrate 1322. In step 1420, a photoresist layer 1324 is adhered onto a substrate top surface 1345, the probe pad 1320, and the contact pads 1335. In step 1430, a portion of the photoresist layer 1324 is removed to expose the contact pad 1335 and probe pad 1320, wherein the photoresist layer 1324 remains over at least a portion of a probe pad top surface 1350. In step 1440, a conductive layer is adhered to the exposed contact pads 1335 and the exposed portion of the probe pad 1320 (the conductive layer forms the contact bumps 1330 and the probe bump 1310). In step 1450, the conductive layer is heated to provide a first reflow that forms the contact bumps 1330 and the probe bump 1310. After the first reflow, the height of the combination of the probe bump 1310 and probe pad 1320 exceeds the height of the combination of the contact bump 1330 and contact pad 1335. In step 1460, the photoresist layer 1324 is removed. In step 1470, the device 1300 is tested by contacting the test probe bottom surface 1110 to the probe bump 1310. Upon completion of testing, in step 1480, a second reflow is performed to reduce the height of the probe bump 1310 by allowing probe bump 1310 to melt and spread out over the area of the probe pad top surface 1350 that was previously covered by the photoresist layer 1324.

It should be appreciated that the present disclosure is intended to encompass numerous embodiments as disclosed herein and further described by the following:

(i). A method of forming a device comprising:
providing a semiconductor die substrate having a contact pad and a probe pad, wherein the contact pad and probe pad are adhered to the substrate;
forming a contact bump by applying a conductive material to a contact structure surface of a contact tower, wherein the contact tower includes the contact pad;
forming a probe bump by applying a conductive material to a probe structure surface of a probe tower, wherein the probe tower includes the probe pad; and
heating the conductive material that forms the contact bump and the probe bump to provide a first reflow, wherein after the first reflow, the height of a top surface of the probe bump exceeds the height of a top surface of the contact bump.

(ii). The method of (i), wherein the contact bump is formed on a contact pillar of the contact tower, the contact pillar situated on the contact pad, and wherein the probe bump is formed on a probe pillar, the probe pillar situated on the probe pad.

(iii). The method of any one of (i)-(ii), further including extending a test probe onto the probe bump.

(iv). The method of any one of (i)-(iii), after performing the first reflow, further including performing a second reflow by heating the probe bump to collapse the probe bump and reduce the height of the top surface of the probe bump, so as to be less than the height of the top surface of the contact bump.

(v). The method any one of (i)-(iv), wherein the second reflow increases the area of a bottom surface of the probe bump.

(vi). The method any one of (i)-(v), wherein the bottom surface of the probe bump is expanded during the second reflow to substantially cover the probe structure surface that the probe bump is formed on.

(vii). The method any one of (i)-(vi), after performing a test using the test probe, further including performing a second reflow by heating at least the probe bump to reduce the height of the probe bump, such that the top surface of the probe bump is equal to the height of the top surface of the contact bump.

(viii). The method of any one of (i)-(vii), further including securing the contact bump to a structure of an interfacing device, after the second reflow.

(ix). The method of any one of (i)-(viii), wherein the probe bump includes a probe bump bottom surface having an area that is less than the area of the probe structure surface that the probe bump is formed on.

(x). The method of any one of (i)-(ix), wherein during the second reflow process, the probe bump bottom surface increases to an area that is equal to the area of the probe structure surface that the probe bump is formed on.

(xi). The method of any one of (i)-(x), wherein prior to applying the conductive material, the contact structure surface of the contact tower is fully exposed to receive and adhere to the conductive material, while only a portion of the probe structure surface of the probe tower is exposed to receive and adhere to the conductive material, and wherein the conductive material is a solder.

(xii). A device comprising:
   a semiconductor die substrate;
   a contact tower mounted on the substrate; and
   a probe tower mounted on the substrate adjacent to the contact tower, the probe tower extending from the substrate to a height less than the height of the contact tower, wherein the probe tower and contact tower are in communication with internal circuitry of the substrate;
   a probe pad and a probe bump, both formed as a portion of the probe tower, wherein the probe bump is formed on a probe tower surface; and
   a contact pad and a contact bump, both formed as a portion of the contact tower, wherein the contact bump is formed on a contact tower surface.

(xiii). The device of (xii), further including:
   a probe pillar formed as a portion of the probe tower, wherein the probe pillar is adhered atop the probe pad and the probe bump is adhered atop the probe pillar; and
   a contact pillar formed as a portion of the contact tower, wherein the contact pillar is adhered atop the contact pad and the contact bump is adhered atop the contact pillar.

(xiv). The device of any one of (xii)-(xiii), wherein the ratio of a probe tower surface area to a contact tower surface area is in the range of about 2.5 to about 5.

(xv). The device of any one of (xii)-(xiv), wherein the ratio of the contact bump height to the probe bump height is in the range of about 1.2 to about 2.2.

(xvi). The device of any one of (xii)-(xv), wherein the probe bump includes a probe bump bottom surface and the contact bump includes a contact bump bottom surface, and the probe bump bottom surface area is greater than the contact bump bottom surface area, and the contact bump height is greater than probe bump height.

(xvii). A method comprising:
   providing a semiconductor die substrate having a contact structure surface and a probe structure surface;
   forming a mask above the substrate, the probe structure surface, and the contact structure surface;
   removing a portion of the mask to expose the contact structure surface and probe structure surface, wherein the mask remains over at least a portion of the probe structure surface;
   adhering a conductive layer onto the exposed contact structure surface to form a contact bump and onto the exposed probe structure surface to form a probe bump; and
   heating the conductive layer that forms the contact bump and the probe bump to provide a first reflow, wherein after the first reflow, the height of the top surface of the probe bump exceeds the height of the top surface of the contact bump.

(xviii). The method of (xvii), further including extending a test probe onto the probe bump without contacting the contact bump with the test probe, and performing a test with the test probe.

(xix). The method any one of (xvii)-(xviii), further including heating at least the probe bump to provide a second reflow to reduce the height of the top surface of the probe bump to less than the height of the top surface of the contact bump.

(xx) The method of any one of (xvii)-(xix), wherein after the first reflow, the difference in height between the top surfaces of the contact bump and the probe bump is in the range of about 10 microns to about 20 microns.

(xxi) The method of any one of (xvii)-(xx), wherein after the second reflow, the difference in height between the top surfaces of the contact bump and the probe bump is in the range of about 5 microns to about 10 microns.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments, including portions of the embodiments and combinations of elements of different embodiments as come within the scope of the following claims. In addition, the various methods for forming the device described herein can include additional steps not described herein, or can omit steps described herein. Further, the various steps can be performed in a different order than described herein.

What is claimed is:

1. A method of forming a device comprising:
   providing a semiconductor die substrate having a contact pad and a probe pad, wherein the contact pad and probe pad are adhered to the substrate;
   forming a contact bump by applying a conductive material to a contact structure surface of a contact tower, wherein the contact tower includes the contact pad and has a height that extends between the substrate top surface and a top surface of the contact bump;
   forming a probe bump by applying a conductive material to a probe structure surface of a probe tower, wherein the probe tower includes the probe pad and has a height that extends between the substrate top surface and a top surface of the probe bump;
   heating the conductive material that forms the contact bump and the probe bump to provide a first reflow, wherein after the first reflow, the height of the probe tower exceeds the height of the contact tower; and
   performing a second reflow by heating the probe bump to reduce the height of the probe tower to less than the height of the contact tower.

2. The method of claim 1, wherein the contact bump is formed on a contact pillar of the contact tower, the contact pillar situated on the contact pad, and wherein the probe bump is formed on a probe pillar, the probe pillar situated on the probe pad.

3. The method of claim 1, further including extending a test probe onto the probe bump.

4. The method of claim 3, after performing a test using the test probe, performing the second reflow.

5. The method of claim 4, further including, after the second reflow, securing the contact bump to a structure of an interfacing device.

6. The method of claim 1, wherein the second reflow increases the area of a bottom surface of the probe bump.

7. The method of claim 6, wherein the bottom surface of the probe bump is expanded during the second reflow to substantially cover the probe structure surface that the probe bump is formed on.

8. The method of claim 1, wherein the probe bump includes a probe bump bottom surface having an area that is less than the area of the probe structure surface that the probe bump is formed on.

9. The method of claim 1, wherein during the second reflow process, the probe bump bottom surface increases to an area that is equal to the area of the probe structure surface that the probe bump is formed on.

10. The method of claim 1, wherein prior to applying the conductive material, the contact structure surface of the contact tower is fully exposed to receive and adhere to the conductive material, while only a portion of the probe structure surface of the probe tower is exposed to receive and adhere to the conductive material, and wherein the conductive material is a solder.

11. The method of claim 1, wherein each of the probe tower and the contact tower have a surface area, and the ratio of a probe tower surface area to a contact tower surface area is in the range of about 2.5 to about 5.

12. The method of claim 1, wherein each of the contact bump and the probe bump have a height, and the ratio of the contact bump height to the probe bump height is in the range of about 1.2 to about 2.2.

13. A method comprising:
providing a semiconductor die substrate having a contact structure surface and a probe structure surface;
forming a mask above the substrate, the probe structure surface, and the contact structure surface;
removing a portion of the mask to expose the contact structure surface and probe structure surface, wherein the mask remains over at least a portion of the probe structure surface;
adhering a conductive layer onto the exposed contact structure surface to form a contact bump having a height and onto the exposed probe structure surface to form a probe bump having a height; and
heating the conductive layer that forms the contact bump and the probe bump to provide a first reflow, wherein after the first reflow, the height of the probe bump exceeds the height of the contact bump; and
performing a second reflow by heating at least the probe bump to reduce the height of the probe bump to less than the height of the contact bump.

14. The method of claim 13, further including extending a test probe onto the probe bump without contacting the contact bump with the test probe, and performing a test with the test probe.

15. The method of claim 13, wherein after the first reflow, the difference in height between the contact bump and the probe bump is in the range of about 10 microns to about 20 microns.

16. The method of claim 13, wherein after the second reflow, the difference in height between the contact bump and the probe bump is in the range of about 5 microns to about 10 microns.

17. A method of forming a device comprising:
providing a substrate comprising a top surface, a contact pad and a probe pad;
forming a contact tower comprising a contact bump on the contact pad and a probe tower comprising a probe bump on the probe pad, the contact tower having a height that extends between the top surface of the substrate and a top surface of the contact bump, and the probe tower having a height that extends between the top surface of the substrate and a top surface of the probe bump;
performing a first reflow by heating the contact bump and the probe bump such that the height of the probe tower exceeds the height of the contact tower; and
performing a second reflow by heating the probe bump to reduce the height of the probe tower to less than the height of the contact tower.

18. The method of claim 17, wherein prior to performing the first reflow, the height of the probe tower is about the same as the height of the contact tower.

19. The method of claim 17, wherein prior to performing the first reflow, the probe bump and the contact bump have about the same height.

20. The method of claim 17, further comprising performing a test of the device by contacting a test probe to the probe bump prior to performing the second reflow.

21. The method of claim 17, further comprising, after performing the second reflow, mounting the device to an interface device.

* * * * *